(12) United States Patent
MacDougall et al.

(10) Patent No.: US 8,079,849 B2
(45) Date of Patent: Dec. 20, 2011

(54) SOCKET CONNECTOR ASSEMBLY WITH COMPRESSIVE CONTACTS

(75) Inventors: Alan Robert MacDougall, Beaverton, OR (US); Robert Daniel Hilty, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 21 days.

(21) Appl. No.: 12/777,719

(22) Filed: May 11, 2010

(65) Prior Publication Data

US 2011/0281445 A1 Nov. 17, 2011

(51) Int. Cl.
*H01R 12/00* (2006.01)
(52) U.S. Cl. .......................................... 439/70
(58) Field of Classification Search .............. 439/68–70, 439/74, 81; 361/785
See application file for complete search history.

(56) References Cited

U.S. PATENT DOCUMENTS

| | | | | |
|---|---|---|---|---|
| 3,805,117 A * | 4/1974 | Hausman | | 361/743 |
| 5,237,743 A * | 8/1993 | Busacco et al. | | 29/885 |
| 6,328,574 B1 | 12/2001 | Howell et al. | | |
| 6,558,169 B2 * | 5/2003 | Figueroa et al. | | 439/70 |
| 7,556,504 B2 * | 7/2009 | Ryu | | 439/70 |
| 2006/0098696 A1 * | 5/2006 | Brown et al. | | 372/20 |

* cited by examiner

*Primary Examiner* — Vanessa Girardi

(57) ABSTRACT

A socket connector assembly includes a housing, signal terminals, and a power module subassembly. The housing is mounted to a circuit board and includes opposing walls having internal surfaces. The signal terminals are joined to the internal surfaces of the walls and engage conductive members disposed along side edges of an electronic package that is received into the housing between the walls. The power module subassembly is coupled to the circuit board between the walls of the housing. The power module subassembly includes a power contact configured to engage a current carrying conductor disposed on a surface of the electronic package that extends between the side edges of the electronic package.

19 Claims, 6 Drawing Sheets

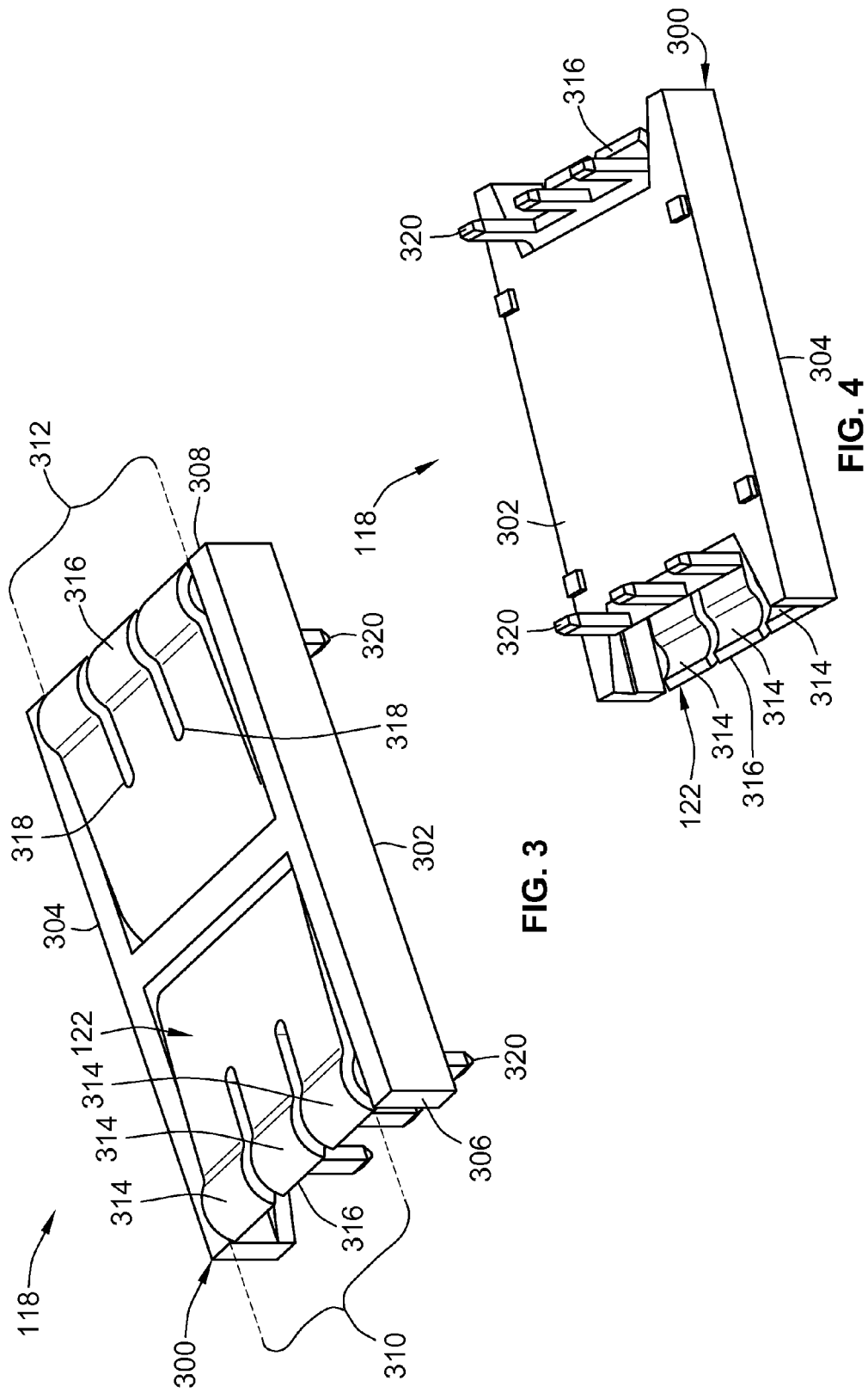

SOCKET CONNECTOR ASSEMBLY WITH COMPRESSIVE CONTACTS

BACKGROUND OF THE INVENTION

The subject matter described herein relates generally to surface mounted connectors, and more specifically, to a socket connector assembly that is mounted to a circuit board.

The ongoing trend toward smaller, lighter, and higher performance electrical components and higher density electrical circuits has led to the development of surface mount technology in the design of printed circuit boards and electronic packages. Surface mountable packaging allows for the connection of a package, such as a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. Socket connectors may include a housing that is mounted to a circuit board with an array of contacts joined to the circuit board or to a substrate of the socket connector and electrically coupled with the circuit board. The socket connector and circuit board may be referred to as a circuit board assembly. The contacts in the array may be disposed such that an electronic package, such as a computer processor, is lowered onto the contacts within the housing of the socket connector. The contacts are used to transfer both power and data signals between the electronic package and the circuit board assembly. The contacts may be conductive receptacles that receive pins of the electronic package (or vice-versa) to transfer the power and data signals therebetween.

Providing the contacts on the substrate or board of the socket connector does have its shortcomings. In order to mate the pins of the electronic package with the receptacles of the socket connector (or vice-versa), a relatively significant force must be applied on the electronic package in a loading direction toward the substrate or board. If too large, this force may cause structural bending of the socket connector and the circuit board assembly, thereby reducing performance of the circuit board assembly. If too small, this force may not mate all of the pins with the receptacles.

Additionally, locating all of the contacts of the socket connector on the substrate or board limits the number of contacts that may be used to communicate data signals. For example, if some of the contacts are used to transfer current from the circuit board to the electronic package to power the electronic package, than these contacts may be unavailable to also communicate data signals.

A need exists for a socket connector that reduces the force required to mate an electronic package with the connector and/or that increases the contacts that are available to communicate data signals between the electronic package and the socket connector.

BRIEF DESCRIPTION OF THE INVENTION

In one embodiment, a socket connector assembly is provided. The socket connector assembly includes a housing, signal terminals, and a power module subassembly. The housing is mounted to a circuit board and includes opposing walls having internal surfaces. The signal terminals are joined to the internal surfaces of the walls and engage conductive members disposed along side edges of an electronic package that is received into the housing between the walls. The power module subassembly is coupled to the circuit board between the walls of the housing. The power module subassembly includes a power contact configured to engage a current carrying conductor disposed on a surface of the electronic package that extends between the side edges of the electronic package.

In another embodiment, another socket connector assembly is provided. The socket connector assembly includes a housing and conductive terminals. The housing is mounted to a circuit board and includes opposing walls having internal surfaces. The terminals are joined to the internal surfaces of the walls. The terminals include conductive bodies and dielectric layers. The bodies have opposite sides and mating surfaces that interconnect the sides. The dielectric layers are disposed on at least one of the sides. The mating surfaces engage conductive members disposed along side edges of an electronic package that is received into the housing between the walls and the dielectric layers separate the bodies of adjacent terminals from each other.

In another embodiment, another socket connector assembly is provided. The socket connector assembly includes a housing, compressible signal terminals, and a compressible power contact. The housing is mounted to a circuit board and includes opposing walls having internal surfaces. The signal terminals are joined to the internal surfaces of the walls. The signal terminals engage conductive members disposed along side edges of an electronic package that is received into the housing along a loading direction. The power contact is coupled to the circuit board between the walls of the housing and engages a current carrying conductor of the electronic package. The power contact is compressed in a direction along the loading direction and the signal terminals are compressed in directions that are perpendicular to the loading direction.

BRIEF DESCRIPTION OF THE DRAWINGS

FIG. 3 is a perspective view of a power module subassembly shown in FIG. 1 in accordance with one embodiment.

FIG. 4 is another perspective view of the power module subassembly shown in FIG. 1 in accordance with one embodiment.

DETAILED DESCRIPTION OF THE INVENTION

Figure 1:
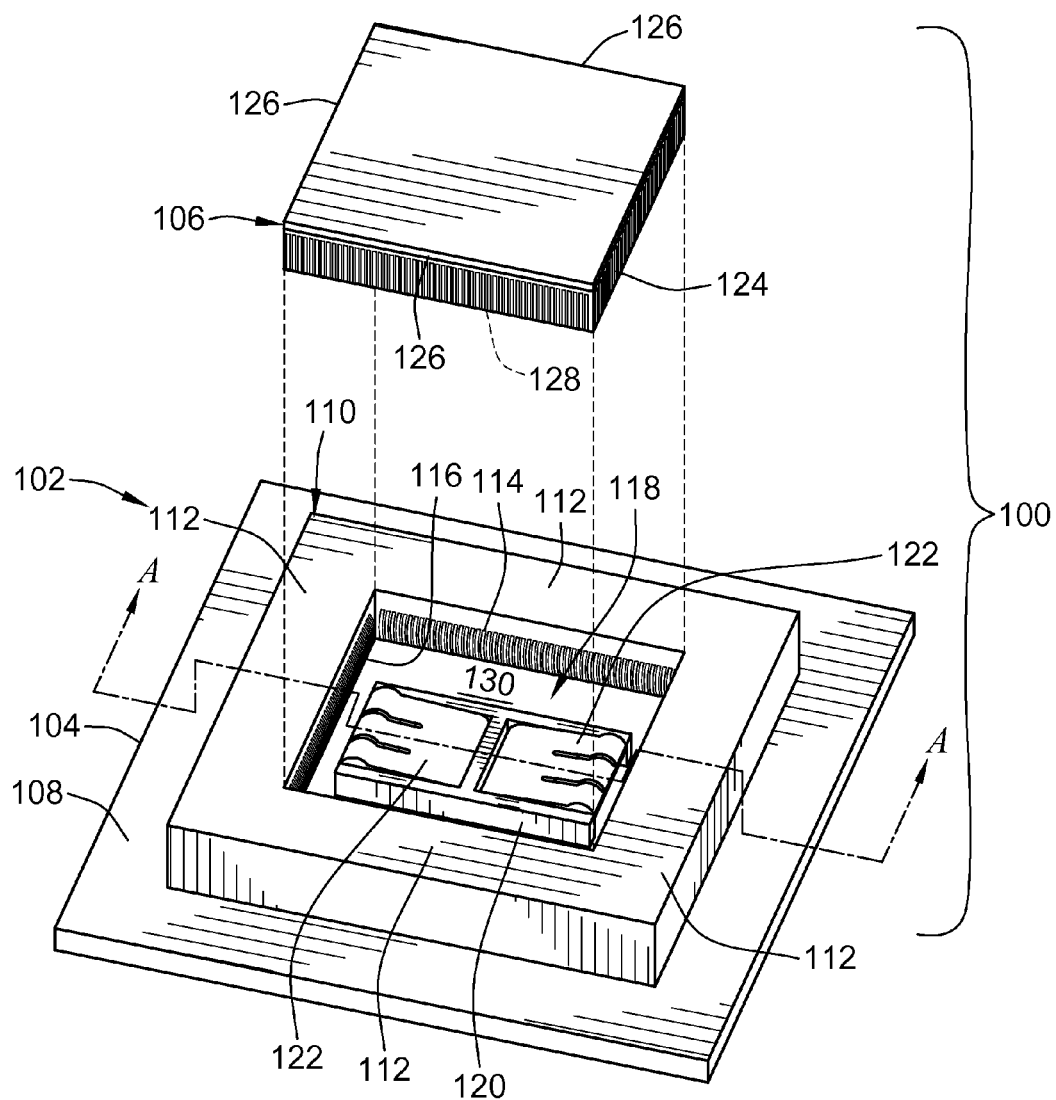
FIG. 1 illustrates an electronic system having a socket connector assembly formed in accordance with an exemplary embodiment.

FIG. 1 illustrates an electronic system 100 having a socket connector assembly 102 formed in accordance with an exemplary embodiment. The socket connector assembly 102 is mounted to a circuit board 104, such as a computer motherboard, and receives an electronic package 106 to electrically couple the electronic package 106 with the circuit board 104.

The electronic package 106 may be a circuit board or other electronic device, such as a land grid array (LGA) or ball grid array (BOA) device. The LGA or BGA devices may be a chip or module, such as, but not limited to, a central processing unit (CPU), microprocessor, or an application specific integrated circuit (ASIC), or the like. The socket connector assembly 102 may be used to establish board-to-board, board-to-device, and/or device-to-device electrical connections.

The socket connector assembly 102 is mounted on a surface 108 of the circuit board 104. The socket connector assembly 102 includes a housing 110 that is coupled to the circuit board 104. The housing 110 may be a dielectric body that includes two sets of opposing walls 112. The walls 112 include internal surfaces 114 that face each other and are oriented perpendicular to the surface 108 of the circuit board 104 in the illustrated embodiment. The housing 110 completely surrounds a receiving area 130 of the socket connector assembly 102, or alternatively, may have separate components provided at predetermined portions of the socket connector assembly 102. For example, the walls 112 may extend around the receiving area 130 of the socket connector assembly 102 such that the internal surfaces 114 intersect one another. The electronic package 106 is loaded into the receiving area 130 when the electronic package 106 mates with the socket connector assembly 102.

Conductive signal terminals 116 are disposed side-by-side along each of the internal surfaces 114 of the housing 110. Alternatively, gaps may be provided between adjacent signal terminals 116 and/or the signal terminals 116 may be provided on less than all of the four internal surfaces 114.

A power module subassembly 118 is mounted to the circuit board 104 within the housing 110. For example, the power module subassembly 118 may be disposed between the opposing walls 112 in each of the two sets of opposing walls 112. In the illustrated embodiment, the power module subassembly 118 includes a dielectric frame 120 with two conductive power contacts 122 disposed therein. Alternatively, a different number of power contacts 122 may be provided.

The electronic package 106 includes several conductive members 124 disposed side-by-side along outer side edges 126 of the electronic package 106. The conductive members 124 may be spaced along the side edges 126 such that the conductive members 124 engage the signal terminals 116 of the socket connector assembly 102. As described below, the electronic package 106 includes current carrying conductors 200 (shown in FIG. 2) disposed on a bottom surface 128 of the electronic package 106. The electronic package 106 is received within the housing 110 of the socket connector assembly 102 between the internal surfaces 114 of the walls 112. The conductive members 124 along the side edges 126 of the electronic package 106 engage the signal terminals 116 of the socket connector assembly 102 and the current carrying conductors 200 along the surface 128 engage the power contacts 122 of the socket connector assembly 102 when the electronic package 106 is loaded into the socket connector assembly 102. In one embodiment, data signals are communicated between the conductive members 124 and the signal terminals 116 and power, such as electric current, is transferred between the current carrying conductors 200 and the power contacts 122. For example, data signals that do not power another device, such as directions, instructions, and information, may be communicated between the electronic package 106 and the socket connector assembly 102 using the conductive members 124 and signal terminals 116 while electric current may be supplied from the power contacts 122 to the current carrying conductors 200 in order to energize the electronic package 106.

Figure 2:
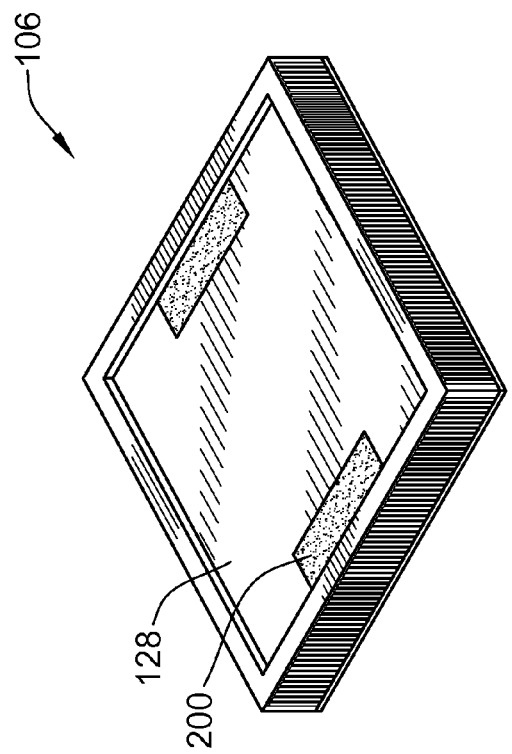
FIG. 2 is a perspective view of an electronic package shown in FIG. 1 in accordance with one embodiment.

FIG. 2 is a perspective view of the electronic package 106 in accordance with one embodiment. As shown in FIG. 2, the surface 128 includes two current carrying conductors 200. Alternatively, a different number of current carrying conductors 200 may be provided. The current carrying conductors 200 may be conductive pads that mate with the power contacts 122 (shown in FIG. 1) to transfer electric current from the socket connector assembly 102 (shown in FIG. 1) to the electronic package 106.

FIG. 3 is a perspective view of the power module subassembly 118 in accordance with one embodiment. FIG. 4 is another perspective view of the power module subassembly 118 in accordance with one embodiment. FIG. 3 may be referred to as a view of the top of the power module subassembly 118 while FIG. 4 may be referred to as a view of the bottom of the power module subassembly 118. The power module subassembly 118 includes a dielectric frame 300 that extends between a mounting side 302 and an opposite side 304. The frame 300 also extends between opposite ends 306, 308 that extend between the sides 302, 304. The mounting side 302 is coupled to the surface 108 (shown in FIG. 1) of the circuit board 104 (shown in FIG. 1). The opposite side 304 includes two windows 310, 312 (shown in FIG. 3) that define open areas or volumes of the frame 300 that are accessible from the side 304. Alternatively, a different number of windows 310, 312 may be provided.

As shown in FIG. 3, one of the power contacts 122 is provided in each of the windows 310, 312. The power contacts 122 extend from mounting ends 320 to outer ends 316 through the frame 300. The mounting ends 320 may be pins that are inserted into conductive vias (not shown) of the circuit board 104 (shown in FIG. 1) to electrically couple the power contacts 122 with the circuit board 104. The power contacts 122 include spring leafs or fingers 314 that extend out to the outer ends 316. In the illustrated embodiment, the power contacts 122 are formed as single conductive bodies with linear cuts 318 (shown in FIG. 3) extending into the power contacts 122 from the outer ends 316 to form the fingers 314. While three fingers 314 are shown in the illustrated embodiment, alternatively a different number of fingers 314 may be provided.

The fingers 314 may be independently flexible with respect to one another. For example, the current carrying conductors 200 (shown in FIG. 2) of the electronic package 106 (shown in FIG. 1) may compress the fingers 314 toward the mounting side 302 of the frame 300 when the electronic package 106 is loaded into the socket connector assembly 102 (shown in FIG. 1). The fingers 314 may be deflected toward the mounting side 302 by different amounts based on the alignment of the current carrying conductors 200 with respect to the fingers 314. The fingers 314 may be resilient to ensure that the fingers 314 maintain contact with the current carrying conductors 200. The independently resilient fingers 314 may ensure that the fingers 314 maintain contact with the current carrying conductors 200 regardless of the orientation of the current carrying conductors 200 with respect to the power contacts 122. Alternatively, the fingers 314 may not be formed in the power contacts 122. For example, the linear cuts 318 may not be present in the power contacts 122.

Figure 5:
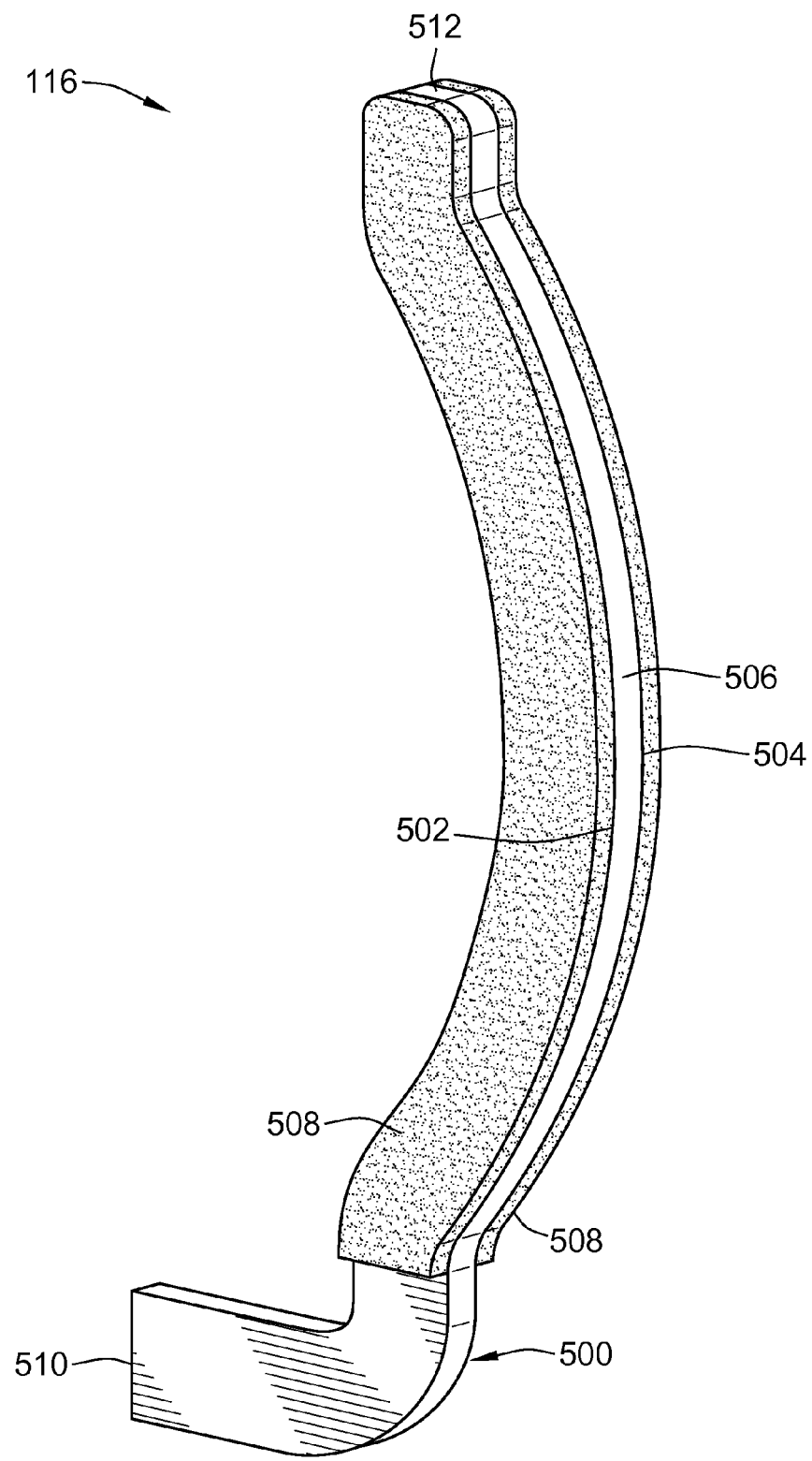
FIG. 5 is a perspective view of a signal terminal shown in FIG. 1 in accordance with one embodiment.

FIG. 5 is a perspective view of one of the signal terminals 116 in accordance with one embodiment. The signal terminal 116 includes an approximately planar conductive body 500 having opposite sides 502, 504 that are interconnected by a mating side 506. Dielectric layers 508 are disposed on each of the sides 502, 504 in the illustrated embodiment. Alternatively, only a single dielectric layer 508 may be provided on one of the sides 502, 504. The dielectric layers 508 may be deposited on the sides 502, 504 using photolithography or another technique. The signal terminals 116 may be disposed along the internal surfaces 114 (shown in FIG. 1) of the socket connector assembly 102 (shown in FIG. 1) at a relatively small pitch dimension. For example, the signal terminals 116 may be provided along the internal surfaces 114 such that the dielectric layers 508 of one signal terminal 116 abut or engage the dielectric layers 508 of adjacent signal terminals 116. Alternatively, a small space or gap may be provided between the dielectric layers 508 of adjacent signal terminals 116. The dielectric layers 508 separate the conductive bodies 500 of adjacent signal terminals 116 to avoid shorting or electrically coupling two or more signal terminals 116.

The mating side 506 is a portion of the conductive body 500 that is uncovered by the dielectric layers 508. The mating side 506 is engaged by the conductive member 124 (shown in FIG. 1) of the electronic package 106 (shown in FIG. 1) to electrically couple the signal terminal 116 with the conductive member 124. As shown in FIG. 5, the signal terminal 116 has a curved shape that extends from a fixation end 510 to an outer end 512. Alternatively, the signal terminal 116 may have a different shape. The curved shape of the signal terminal 116 allows the signal terminal 116 to be compressed against the housing 110 (shown in FIG. 1) of the socket connector assembly 102 (shown in FIG. 1) when the conductive members 124 (shown in FIG. 1) of the electronic package 106 (shown in FIG. 1) engage the signal terminals 116.

Figure 6:
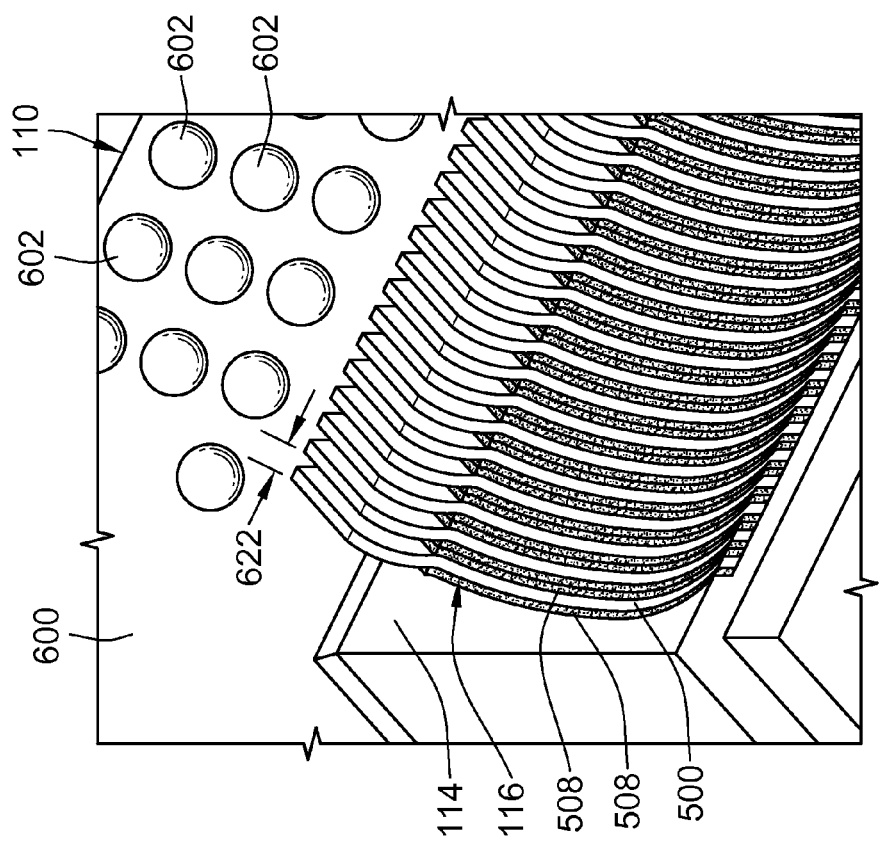
FIG. 6 is a perspective view of a portion of the socket connector assembly shown in FIG. 1 in accordance with one embodiment.

FIG. 6 is a perspective view of a portion of the socket connector assembly 102 in accordance with one embodiment. FIG. 6 shows a view of a mounting side 600 of the housing 110. The mounting side 600 may be coupled to the circuit board 104 (shown in FIG. 1) using a ball grid array 602. Alternatively, the housing 110 may be mounted to the circuit board 104 in a different manner. Several signal terminals 116 are disposed along the inner surfaces 114 of the housing 110. The signal terminals 116 wrap around the interface between the inner surface 114 and the mounting side 600 of the housing 110. Conductive pathways such as electric traces (not shown) may electrically join the signal terminals 116 with the ball grid array 602. The conductive solder of the ball grid array 602 may be electrically coupled with conductive pads (not shown) on the surface 108 (shown in FIG. 1) of the circuit board 104) to electrically join the signal terminals 116 with the circuit board 104.

The signal terminals 116 may be disposed side-by-side as shown in the illustrated embodiment. Alternatively, the signal terminals 116 may be separated from one another by a gap. Adjacent signal terminals 116 are prevented from electrically coupling or shorting with each other because of the dielectric layers 508 disposed between the conductive bodies 500 of the adjacent signal terminals 116. Depending on the thickness of the conductive bodies 500, the thicknesses of the dielectric layers 508, and/or the number of dielectric layers 508, a pitch dimension 622 between adjacent signal terminals 116 may be relatively small. The pitch dimension 622 represents the distance between the same points on adjacent signal terminals 116. In one embodiment, the pitch dimension 622 of the signal terminals may be 0.20 to 0.30 millimeters. Alternatively, the pitch dimension 622 may be 0.10 to 0.20 millimeters. In another embodiment, the pitch dimension 622 may be smaller or larger than the above examples.

Figure 7:
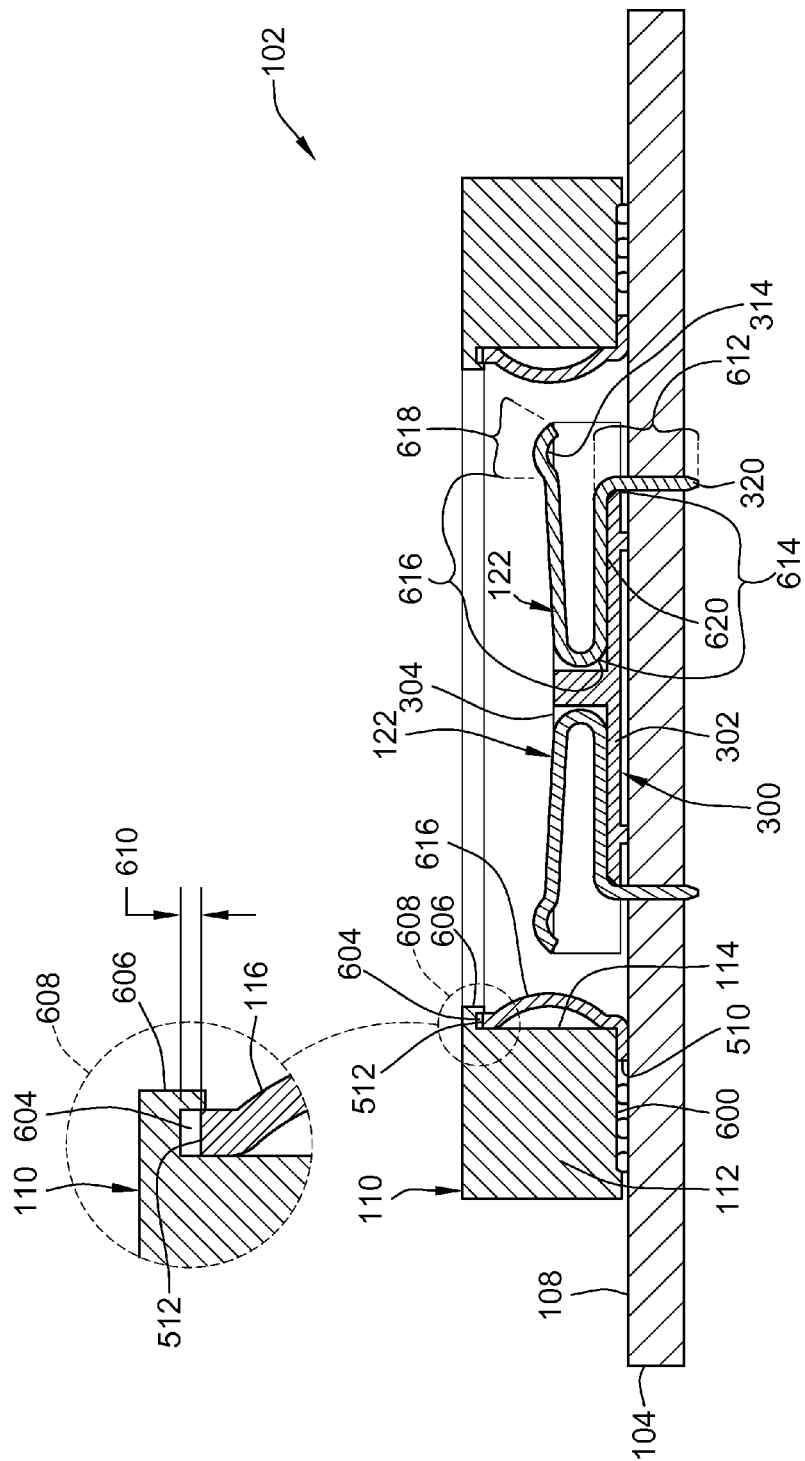
FIG. 7 is a cross-sectional view of the socket connector assembly shown in FIG. 1 in an unmated state taken along line A-A in FIG. 1 in accordance with one embodiment.

FIG. 7 is a cross-sectional view of the socket connector assembly 102 in an unmated state taken along line A-A in FIG. 1 in accordance with one embodiment. The signal terminals 116 and power contacts 122 are shown in an uncompressed state as the electronic package 106 (shown in FIG. 1) has not been loaded into the socket connector assembly 102. As shown in FIG. 7, the signal terminals 116 and the power contacts 122 are spaced apart from each other. The signal terminals 116 may be joined to the housing 110 while the power contacts 122 are joined to the frame 300. The power contacts 122 are not coupled to the housing 110, the signal terminals 116 are not joined to the frame 300, and the housing 110 and the frame 300 are spatially separated or spaced apart from each other in the illustrated embodiment. For example, the housing 110 and the frame 300 do not engage each other.

The signal terminals 116 curve away from the internal surfaces 114 of the housing 110. The fixation ends 510 are disposed between the mounting side 600 of the housing 110 and the circuit board 104. The fixation ends 510 may be coupled to the housing 110 to secure the signal terminals 116 to the housing 110. The outer ends 512 may be uncoupled from the housing 110 and may be free to move or slide along the internal surfaces 114 of the housing 110.

The outer ends 512 of the signal terminals 116 are disposed in an internal groove 604 of the housing 110. The housing 110 includes a ledge 606 that extends from each of the walls 112 in a direction that is parallel to the surface 108 of the circuit board 104. For example, the ledge 606 extends from each of the walls 112 toward the opposite wall 112. The internal groove 604 is a recess that extends into the ledge 606 in a direction oriented away from the circuit board 104. The signal terminals 116 engage the housing 110 in locations that are proximate to the mounting side 600 and the groove 604. For example, the signal terminals 116 engage the walls 112 at or near the intersection of the internal surfaces 114 and the mounting side 600 and at or near the groove 604. As shown in the inset 608, the outer ends 512 are separated from the housing 110 in the groove 604 by a gap 610.

The power contacts 122 have an approximate C- or U-shape in the illustrated embodiment. Each power contact 122 may be a unitary conductive body that extends from the mounting end 320 to the outer end 316. The power contacts 122 may be divided into sections that include a coupling section 612, an engagement section 614, a spring section 616, and a mating section 618. As shown in FIG. 7, the coupling section 612 extends from the mounting end 320 to the engagement section 614 and may be generally oriented perpendicular to the surface 108 of the circuit board 104. The coupling section 612 may be loaded into the circuit board 104 to secure and electrically couple the power contacts 122 to the circuit board 104. The engagement section 614 extends from the coupling section 612 to the spring section 616. The engagement section 614 may engage or rest on an internal surface 620 of the frame 300. The internal surface 620 may be a surface that is oriented parallel to the sides 302, 304 and is disposed between the sides 302, 304. Alternatively, the engagement section 614 may be disposed above the frame 300 and engage the internal surface 620 when the power contact 122 is compressed by the current carrying conductors 200 (shown in FIG. 2) of the electronic package 106 (shown in FIG. 1). In the illustrated embodiment, the engagement section 614 is oriented approximately parallel to the sides 302, 304 and internal surface 620.

The spring section 616 extends from the engagement section 614 to the mating section 618. The spring section 616 may be deflected toward the circuit board 104 when the current carrying conductors 200 (shown in FIG. 2) of the electronic package 106 (shown in FIG. 1) engage the power contacts 122. The mating sections 618 include the portions of the power contacts 122 that engage the current carrying conductors 200. In the illustrated embodiment, the mating section 618 includes a curved portion of the power contact 122 that extends above the side 304 of the frame 300. The spring fingers 314 of the power contacts 122 may include the entirety of the mating sections 618 and part of the spring sections 616.

Figure 8:
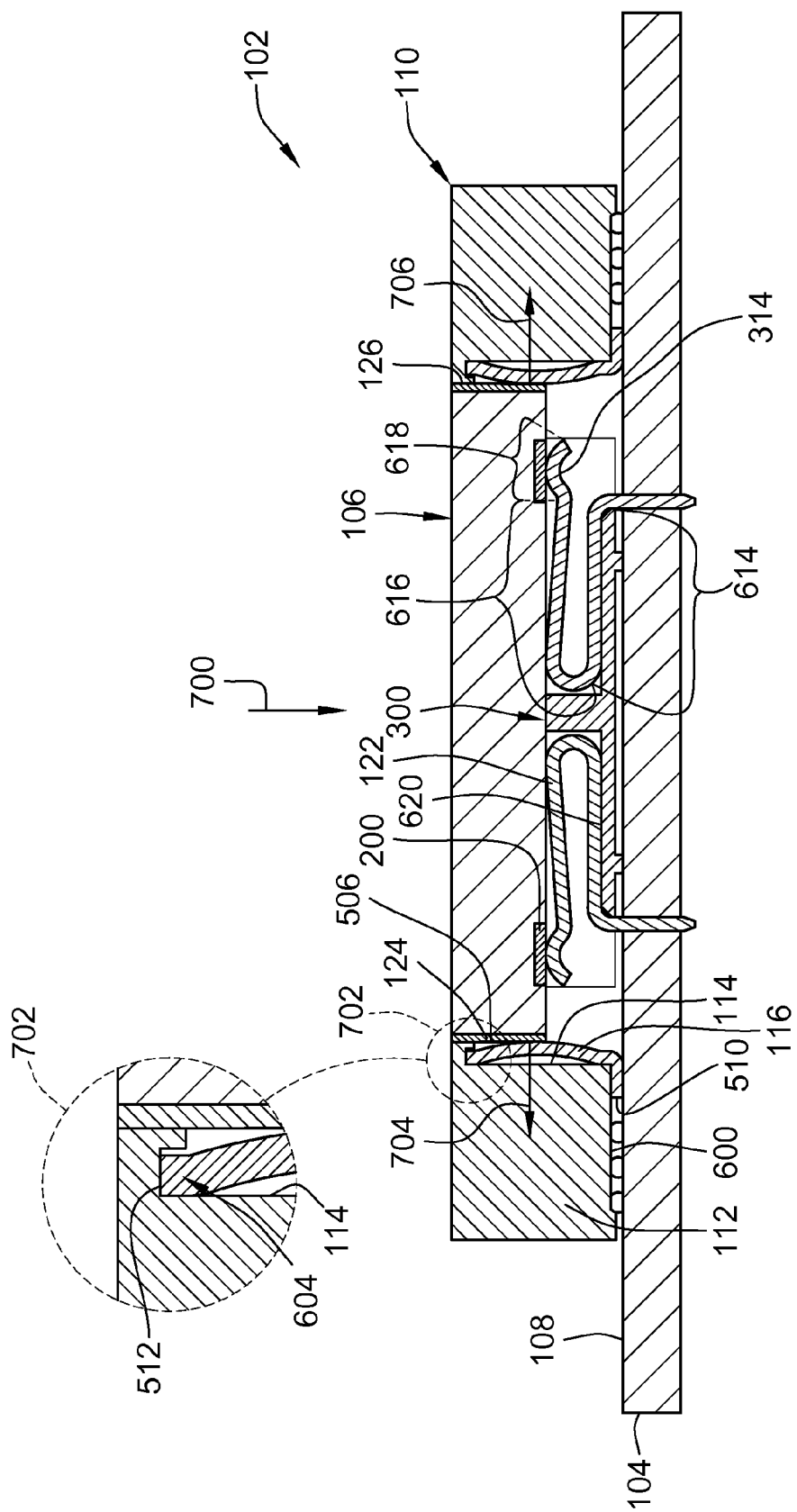
FIG. 8 is a cross-sectional view of the socket connector assembly shown in FIG. 1 mated with the electronic package also shown in FIG. 1 along line A-A in FIG. 1 in accordance with one embodiment.

FIG. 8 is a cross-sectional view of the socket connector assembly 102 mated with the electronic package 106 along line A-A in FIG. 1 in accordance with one embodiment. The electronic package 106 is loaded into the housing 110 of the socket connector assembly 102 along a loading direction 700 that is oriented perpendicular to the surface 108 of the circuit board 104. The electronic package 106 is inserted between the opposing walls 112 of the housing 110 until the current carrying conductors 200 engage the power contacts 122 and the conductive members 124 engage the signal terminals 116. The current carrying conductors 200 engage the spring fingers 314 in the mating sections 618 of the power contacts 122 to electrically couple the current carrying conductors 200 with the power contacts 122. The conductive members 124 engage the mating sides 506 of the signal terminals 116 to electrically couple the conductive members 124 with the signal terminals 116.

As shown in FIG. 8, the power contacts 122 are compressed between the current carrying conductors 200 of the electronic package 106 and the internal surface 620 of the frame 300. The spring sections 616 are downwardly deflected in directions that are parallel to the loading direction 700 and the engagement section 614 engages the internal surface 620 such that the power contacts 122 provide a resilient force in directions that are opposite to the loading direction 700. The resilient forces applied by the power contacts 122 may maintain engagement between the current carrying conductors 200 and the mating sections 618 of the power contacts 122.

The signal terminals 116 are compressed between the conductive members 124 of the electronic package 106 and the internal surfaces 114 of the housing 110. As described above, the fixation ends 510 and the outer ends 512 may engage the housing 110. The fixation ends 510 may be coupled to the housing 110 and incapable of moving relative to the housing 110. The outer ends 512 may engage the internal surfaces 114 with freedom to slide or move along the internal surfaces 114. For example, as shown in the inset 702, the outer ends 512 may slide along the internal surfaces 114 away from the mounting side 600 until the outer ends 512 engage the housing 110 inside the groove 604. Alternatively, the outer ends 512 may slide along the internal surfaces 114 but not engage the housing 110 such that the gap 610 (shown in FIG. 7) between the outer ends 512 and the housing 110 is reduced.

The signal terminals 116 engage the housing 110 at or near the outer ends 512 and at or near the fixation ends 510 such that the curved signal terminals 116 are compressed toward the housing 110. The signal terminals 116 may be slightly deflected toward the internal surfaces 114 by the electronic package 106. For example, the signal terminals 116 may be deflected toward the internal surfaces 114 in mating directions 704, 706. As shown in FIG. 8, the mating directions 704, 706 are oriented perpendicular to the loading direction 700 from the side edges 126 of the electronic package 106 toward the internal surfaces 114 of the housing 110. Although the mating directions 704, 706 are shown for the signal terminals 116 along only two of the internal surfaces 114 in FIG. 8, the signal terminals 116 along the other internal surfaces 114 also may be deflected toward the housing 110 in mating directions (not shown) that are perpendicular to the loading direction 700.

The signal terminals 116 may provide resilient forces in directions oriented opposite of the mating directions 704, 706 to retain the electronic package 106 in the housing 110. The forces applied by the signal terminals 116 may prevent the electronic package 106 from being removed from the housing 110 without a user providing a removal force in a direction that is oriented opposite of the loading force.

As described above, the signal terminals 116 and the power contacts 122 are spaced apart from one another. Separating the power contacts 122 from the signal terminals 116 may reduce the insertion force that is required to mate the electronic package 106 with the socket connector assembly 102. For example, in the illustrated embodiment, only the power contacts 122 are compressed along the loading direction 700 while the signal terminals 116 are compressed along the mating directions 704, 706. Therefore, less force may be required in the loading direction 700 to mate the conductive members 124 with the signal terminals 116 and the current carrying conductors 200 with the power contacts 122.

Placing the power contacts 122 on the circuit board 106 between the walls 112 of the housing 110 may free up space along the internal surfaces 114 of the walls 112 for additional signal terminals 116. For example, the dimensions of the electronic package 106 may be fixed or set by an industry or commercial standard. Therefore, the space along the internal surfaces 114 for placing the signal terminals 116 may be established or limited by industry or commercial standards. Separating the power contacts 122 from the signal terminals 116 may permit an increased number of signal terminals 116 to be provided along the internal surfaces 114 in order to increase the amount of data and/or rate at which data signals are communicated between the socket connector assembly 102 and the electronic package 106.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A socket connector assembly comprising:
a housing configured to be mounted to a circuit board, the housing including opposing walls having internal surfaces;
signal terminals joined to the internal surfaces of the walls, the signal terminals configured to engage conductive members disposed along side edges of an electronic package that is received into the housing between the walls; and
a power module subassembly configured to be coupled to the circuit board between the walls of the housing, the power module subassembly including a power contact configured to engage a current carrying conductor disposed on a surface of the electronic package that extends between the side edges of the electronic package.

2. The socket connector assembly of claim 1, wherein the signal terminals comprise elongated conductive beams having opposite sides with a dielectric layer disposed on at least one of the sides.

3. The socket connector assembly of claim 1, wherein the signal terminals comprise elongated beams extending from fixation ends to outer ends, the fixation ends coupled to the housing, the outer ends configured to move along the internal surfaces of the housing when the signal terminals engage the conductive members of the electronic package.

4. The socket connector assembly of claim 1, wherein the signal terminals comprise curved beams that curve away from the internal surfaces of the housing, the beams are deflected toward the internal surfaces when the beams are engaged by the conductive members of the electronic package.

5. The socket connector assembly of claim 1, wherein the signal terminals comprise compressible contacts that electrically couple the electronic package with the circuit board when the signal terminals are compressed between the housing and the electronic package.

6. The socket connector assembly of claim 1, wherein the signal terminals and the power contact are compressible contacts that electrically couple the electronic package with the circuit board when the signal terminals and the power contact are compressed.

7. The socket connector assembly of claim 6, wherein the power contact is compressed in a direction that is parallel to a loading direction in which the electronic package is inserted into the housing, the signal terminals compressed in directions that are perpendicular to the loading direction.

8. A socket connector assembly comprising:
a housing configured to be mounted to a circuit board, the housing including opposing walls having internal surfaces; and
conductive terminals joined to the internal surfaces of the walls, the terminals comprising conductive bodies and dielectric layers, the bodies having opposite sides and mating surfaces that interconnect the sides, the dielectric layers disposed on at least one of the sides, wherein the mating surfaces engage conductive members disposed along side edges of an electronic package that is received into the housing between the walls and the dielectric layers separate the bodies of adjacent terminals from each other.

9. The socket connector assembly of claim 8, wherein the terminals comprise elongated beams extending from fixation ends to outer ends, the fixation ends coupled to the housing, the outer ends configured to move along the internal surfaces of the housing when the terminals engage the conductive members of the electronic package.

10. The socket connector assembly of claim 8, wherein the terminals comprise curved beams that curve away from the internal surfaces of the housing, the beams are deflected toward the internal surfaces when the beams are engaged by the conductive members of the electronic package.

11. The socket connector assembly of claim 8, further comprising a power module subassembly comprises a dielectric frame and a compressible power contact disposed in the frame, the power contact electrically coupling the electronic package with the circuit board when the power contact is compressed between the electronic package and the frame.

12. The socket connector assembly of claim 8, further comprising a power module subassembly configured to be coupled to the circuit board between the walls of the housing, the power module subassembly including a power contact configured to engage a current carrying conductor of the electronic package.

13. The socket connector assembly of claim 12, wherein the terminals and the power contact are compressible contacts that electrically couple the electronic package with the circuit board when the signal terminals and the power contact are compressed.

14. The socket connector assembly of claim 13, wherein the power contact is compressed in a direction that is parallel to a loading direction in which the electronic package is inserted into the housing, the signal terminals compressed in directions that are perpendicular to the loading direction.

15. A socket connector assembly comprising:
a housing configured to be mounted to a circuit board, the housing including opposing walls having internal surfaces;
compressible signal terminals joined to the internal surfaces of the walls, the signal terminals configured to engage conductive members disposed along side edges of an electronic package that is received into the housing along a loading direction; and
a power module subassembly that includes a dielectric frame and a compressible power contact disposed in the frame, the power contact configured to be coupled to the circuit board between the walls of the housing, the power contact configured to engage a current carrying conductor of the electronic package, wherein the power contact is compressed in a direction along the loading direction and the signal terminals are compressed in directions that are perpendicular to the loading direction when the electronic package is received in the housing.

16. The socket connector assembly of claim 15, wherein the signal terminals comprise elongated beams extending from fixation ends to outer ends, the fixation ends coupled to the housing, the outer ends configured to move along the internal surfaces of the housing when the signal terminals engage the conductive members of the electronic package.

17. The socket connector assembly of claim 15, wherein the signal terminals comprise curved beams that curve away from the internal surfaces of the housing, the beams are deflected toward the internal surfaces when the beams are engaged by the conductive members of the electronic package.

18. The socket connector assembly of claim 15, wherein the signal terminals comprise elongated conductive beams having opposite sides with a dielectric layer disposed on at least one of the sides.

19. The socket connector assembly of claim 18, wherein the dielectric layers of the signal terminals separate the conductive beams of adjacent signal terminals from each other.

* * * * *